United States Patent
Takahashi

(10) Patent No.: US 10,381,945 B2
(45) Date of Patent: Aug. 13, 2019

(54) GATE DRIVING APPARATUS

(71) Applicant: FUJI ELECTRIC CO., LTD., Kawasaki-shi, Kanagawa (JP)

(72) Inventor: Kiyoshi Takahashi, Sagamihara (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 1 day.

(21) Appl. No.: 15/716,680

(22) Filed: Sep. 27, 2017

(65) Prior Publication Data
US 2018/0102714 A1    Apr. 12, 2018

(30) Foreign Application Priority Data
Oct. 7, 2016 (JP) ................................. 2016-199233

(51) Int. Cl.
H02M 7/00 (2006.01)
H05K 7/20 (2006.01)
H02M 1/08 (2006.01)

(52) U.S. Cl.
CPC ........ H02M 7/003 (2013.01); H05K 7/20409 (2013.01); H02M 1/08 (2013.01)

(58) Field of Classification Search
CPC .... H02M 7/003; H02M 1/08; H03K 7/20409; H05K 7/20409
USPC ............................................................. 327/537
See application file for complete search history.

(56) References Cited

U.S. PATENT DOCUMENTS

| 4,394,530 A * | 7/1983 | Kaufman | ................ H01L 23/15 174/16.3 |
| 6,181,006 B1 * | 1/2001 | Ahl | ..................... H01L 23/4006 257/712 |
| 6,849,943 B2 * | 2/2005 | Thurk | ..................... H02M 1/44 257/675 |
| 7,633,153 B2 * | 12/2009 | Shimokawa | .......... H01L 21/565 257/706 |

FOREIGN PATENT DOCUMENTS

| EP | 2928057 A1 | 10/2015 |
| JP | 2015-198545 A | 11/2015 |

* cited by examiner

*Primary Examiner* — Dinh T Le
(74) *Attorney, Agent, or Firm* — Rabin & Berdo, P.C.

(57) ABSTRACT

Two insulation covers that can be vertically separated clamp a gate-driving-circuit substrate so as to form a gate driving apparatus. The gate driving apparatus is fixed to a cooler by fixing screws inserted through a pair of insertion bores in the two insulation covers that are arranged in a horizontal direction. A gate control terminal and a ground control terminal provided on the gate-driving-circuit substrate are screwed and fixed to, and thus electrically and mechanically connected to, a corresponding gate control terminal and a corresponding ground control terminal of a power module attached to the cooler. This allows the gate-driving-circuit substrate to be covered with the insulation covers for insulation protection and to be fixed to the cooler using a fixing member such as a screw.

17 Claims, 8 Drawing Sheets

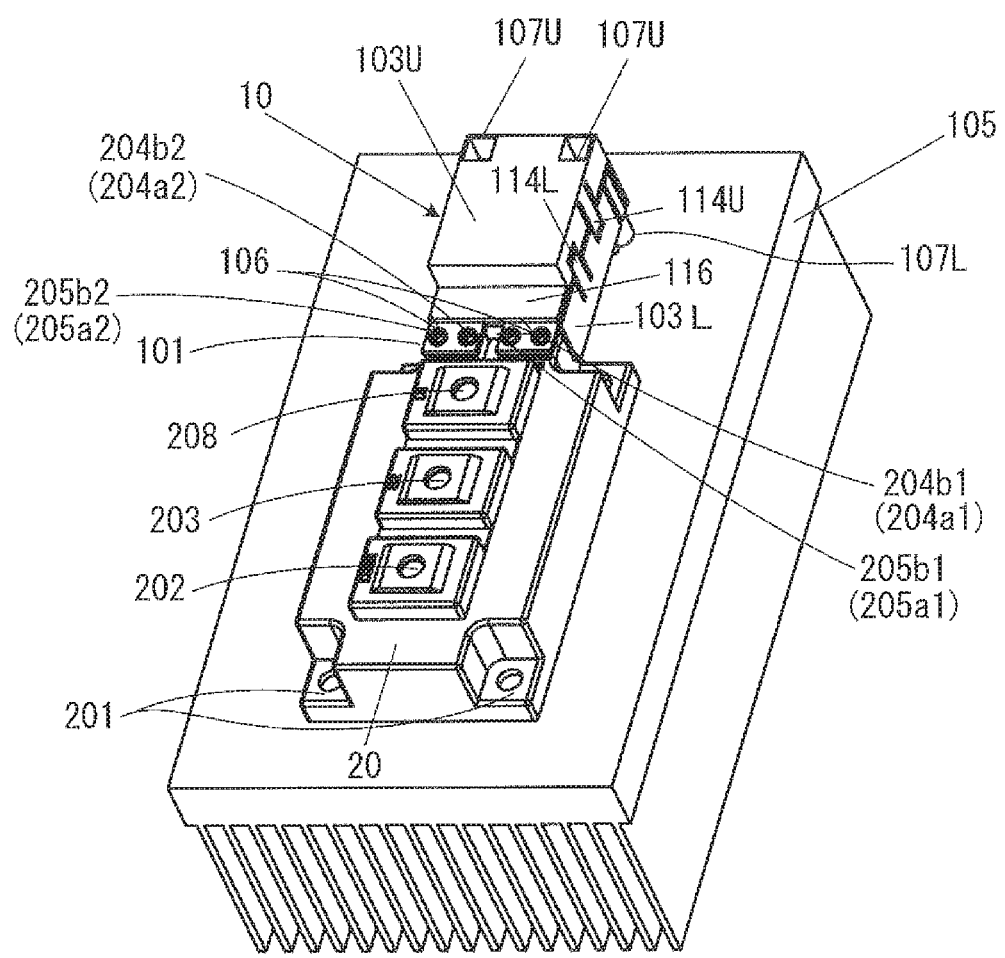
F I G. 2

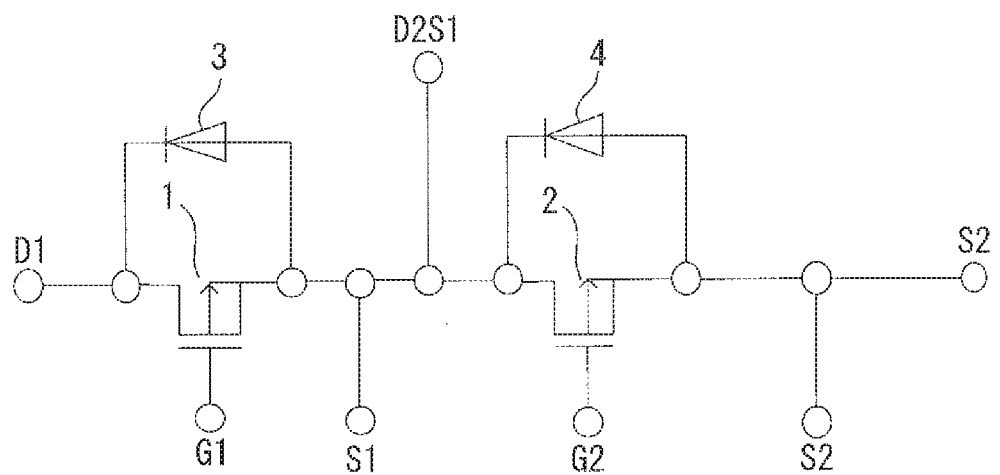
F I G. 3

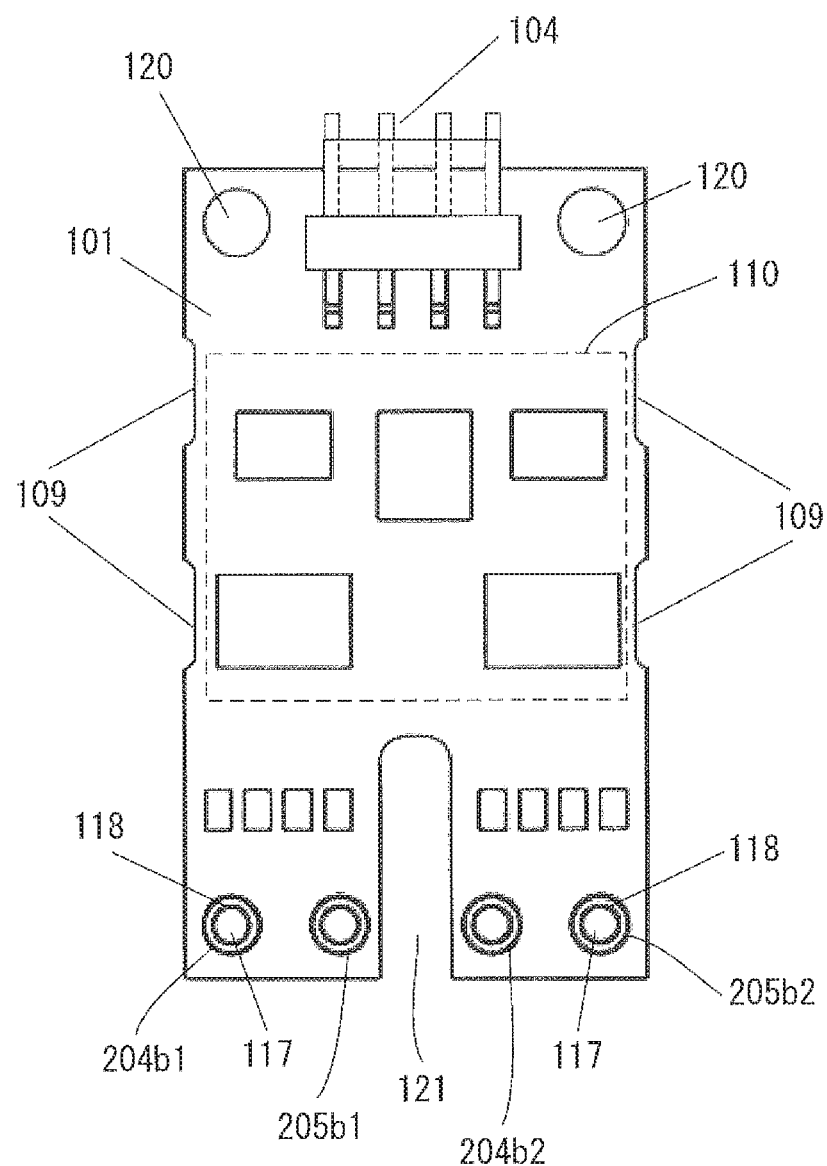
F I G. 4

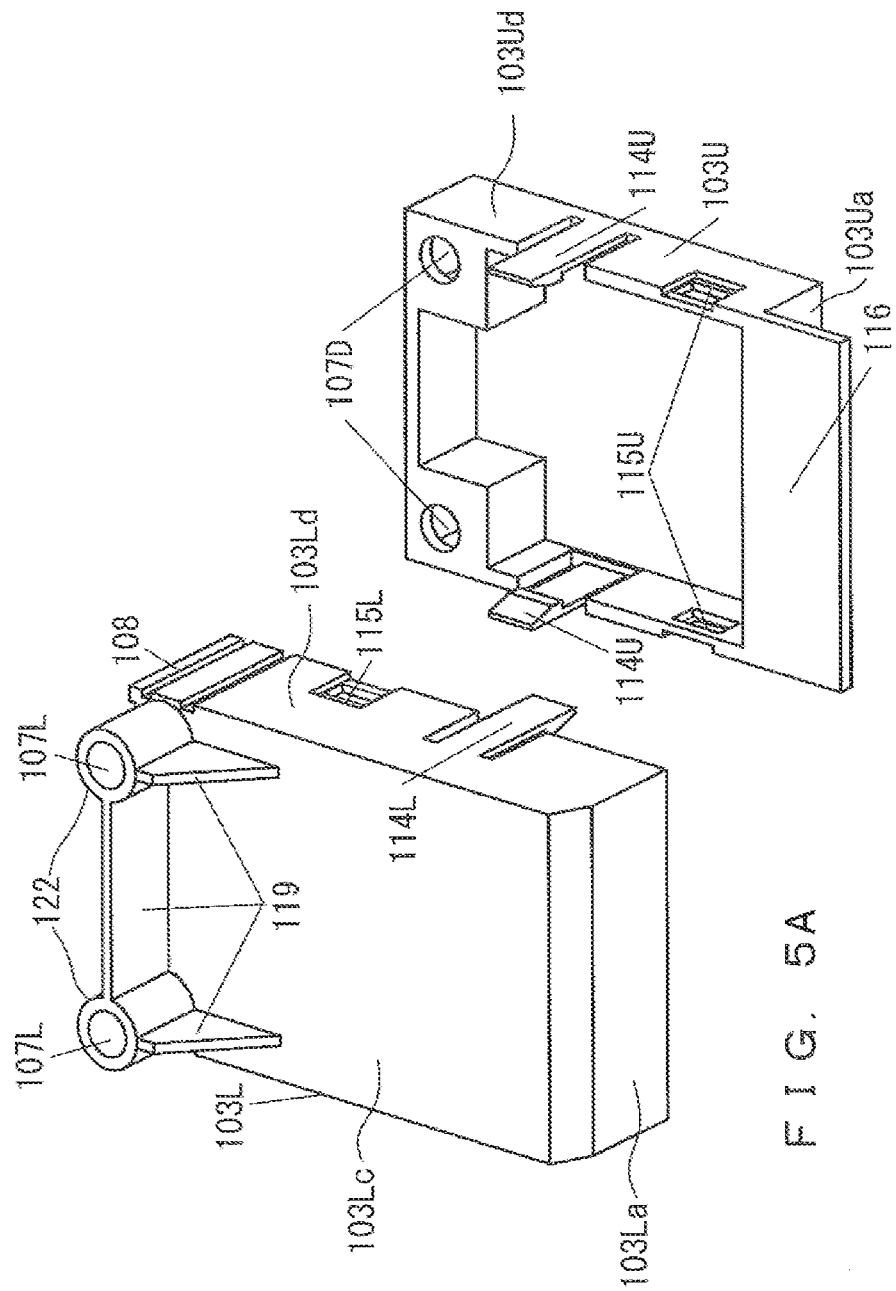

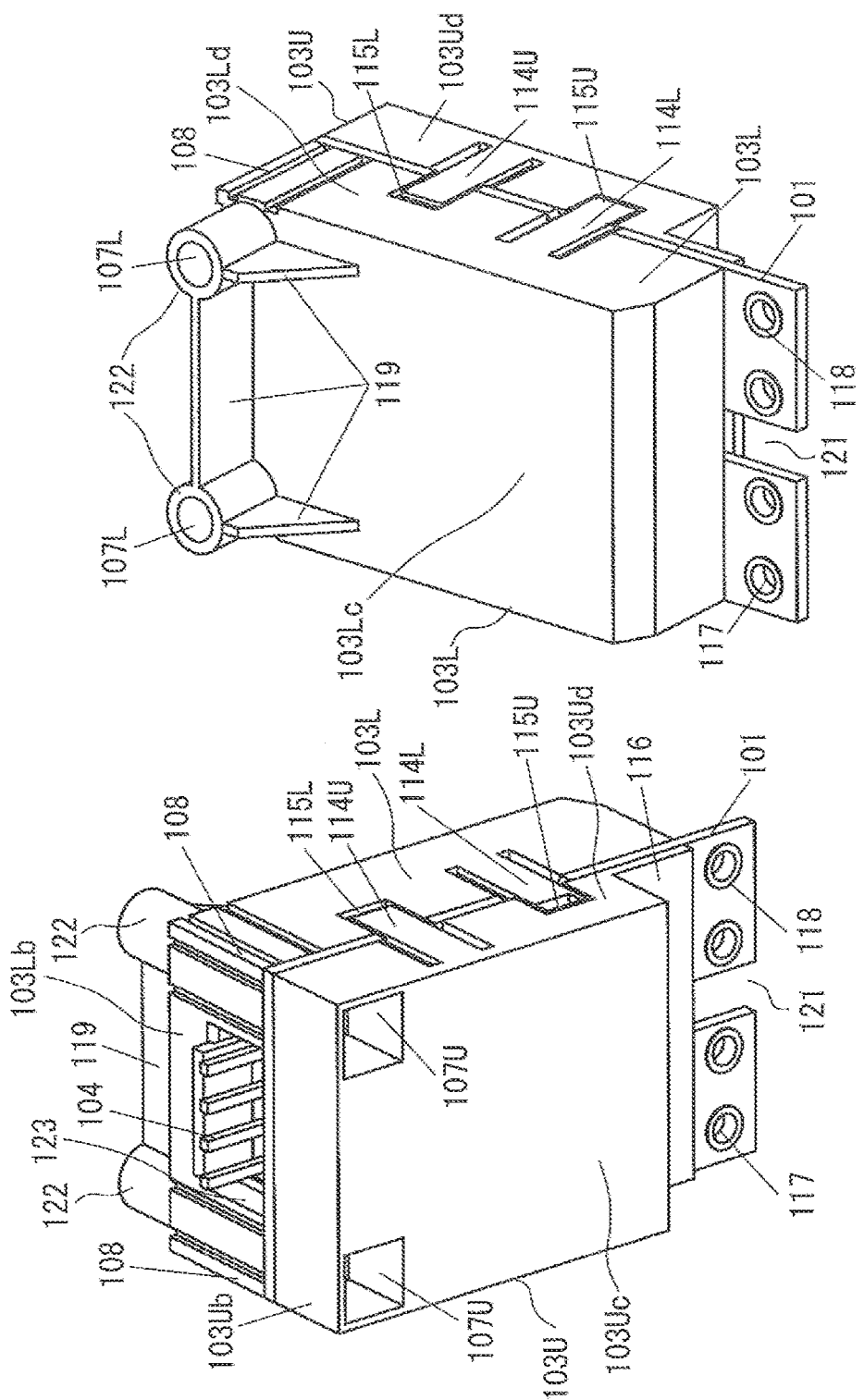

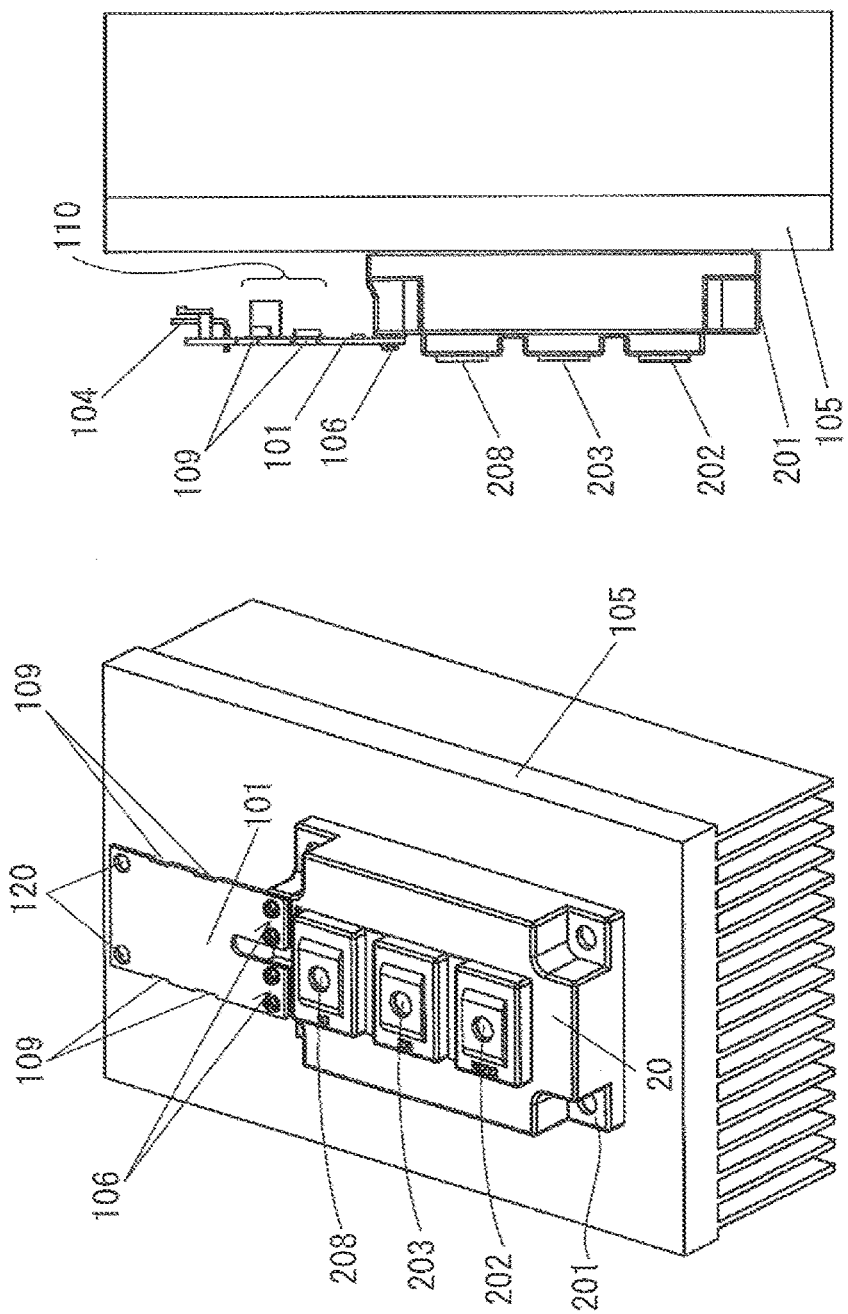

GATE DRIVING APPARATUS

CROSS-REFERENCE TO RELATED APPLICATION

This application is based upon and claims the benefit of priority of the prior Japanese patent application No. JP2016-199233, filed on Oct. 7, 2016, the entire contents of which are incorporated herein by reference.

BACKGROUND OF THE INVENTION

Field of the Invention

The present invention relates to a gate driving apparatus for driving a power module.

Description of Related Art

FIG. 1 is a side view illustrating a mounting structure of a gate driving circuit for driving a power module of a high-voltage, large-current power converting device described in patent document 1. This figure depicts the configuration of one phase of a three-phase inverter.

A power module 27 mounted on a cooler 36 is a 2-in-1 type power-module in which IGBTs (Insulated Gate Bipolar Transistors) for two arms are mounted in one module.

The power module 27 has a high-voltage main terminal 22 and a ground main terminal 23 on a central portion thereof.

A first gate control terminal 24 and a first ground control terminal 25 are located on one side relative to the center of the power module 27, and a second gate control terminal 24 and a second ground control terminal 25 are located on the other side relative to the center of the power module 27.

A capacitor 31 is located above the power module 27 with a power terminal 32 and a ground terminal 33 facing sideways.

The power terminal 32 of the capacitor 31 and the high-voltage main terminal 22 of the power module 27 are connected to each other by an L-shaped main circuit wire 37. The ground terminal 33 of the capacitor 31 and the ground terminal 23 of the power module 27 are connected to each other by an L-shaped main circuit wire 38.

A first control substrate 11 is provided on the bottom-surface side of the capacitor 31 (on the opposite side from the side on which the power terminal 32 and the ground terminal 33 are provided) perpendicularly to the top surface of the cooler 36.

Although not illustrated, the control substrate 11 includes a signal input portion, a power input portion, a logic portion, a protection circuit portion, and a gate driving portion.

A second control circuit 12 is connected to the second gate control terminal 24 and the ground control terminal 25 of the power module 27.

The first substrate 11 and the second circuit 12 are connected to each other by a wiring conductor plate 13 of a laminated structure with an insulation sheet between layers. The wiring conductor plate 13 is located between the power module 27 and the capacitor 31.

In the prior art described in patent document 1, the wiring conductor plate 13 of a laminated structure with an insulation sheet between layers is disposed with the second circuit 12 inserted between the first substrate 11 and a pair of the gate control terminal 24 and the ground terminal 25. How-ever, such a gate wiring structure involves a complicated structure for ensuring insulation properties, thereby leading to a problem of high cost.

Moreover, the gate wiring structure does not have a structure for fixing or holding the first substrate 11 and thus could cause malfunction due to vibrations or an impact.

Patent Document 1: Japanese Laid-open Patent Publication No. 2015-198545 (FIG. 22)

BRIEF SUMMARY OF THE INVENTION

A gate driving apparatus of the present invention is configured to cover a gate-driving-circuit substrate with an insulation cover for simple insulation protection, and to be fixed to a cooler using a fixing member.

In particular, in an aspect of the invention, a gate driving apparatus for driving a power module includes a gate-driving-circuit substrate and an insulation cover.

The gate-driving-circuit substrate includes a gate control terminal and a ground control terminal electrically connected to a gate control terminal and a ground control terminal of the power module.

The portions of the gate-driving-circuit substrate excluding the gate control terminal and the ground control terminal are covered with, and fixed and held within, an insulation cover.

In another aspect of the invention, the insulation cover of the gate driving apparatus is provided with an attaching portion to be supported and fixed on a placement member.

In still another aspect of the invention, the placement member is a cooler to which the power module is attached.

In yet another aspect of the invention, the placement member forms an air channel.

In a further aspect of the invention, the gate control terminal and the ground control terminal of the gate-driving-circuit substrate are mechanically connected and fixed to the gate control terminal and the ground control terminal of the power module.

In a still further aspect of the invention, the insulation cover consists of a first insulation cover and a second insulation cover.

A yet further aspect of the invention is a power converting apparatus that includes the gate driving apparatus.

Another aspect of the invention is a railway-vehicle power converting apparatus that includes the gate driving apparatus.

In the gate driving apparatus of the invention, the gate-driving-circuit substrate is covered with an insulation cover such that insulation from main circuit components can be ensured.

In addition, the gate-driving-circuit substrate is held within the insulation cover so that the gate-driving-circuit substrate can be protected from vibrations and impacts.

BRIEF DESCRIPTION OF THE DRAWINGS

FIG. 2 is a perspective view illustrating the configuration of a gate driving apparatus 10 in accordance with an embodiment of the invention;

FIG. 3 illustrates examples of a circuit configuration and input-output terminals of a 2-in-1 type power-module;

FIG. 4 is a plane view illustrating the configuration of a gate-driving-circuit substrate in accordance with an embodiment of the invention;

FIGS. 5A and 5B are perspective views illustrating the structures of a cover 103L and a cover 103U in accordance with an embodiment of the invention;

FIG. 6A is a top perspective view and FIG. 6B is a bottom perspective view illustrating the configuration of a gate driving apparatus 10 in accordance with an embodiment of the invention;

FIG. 7A is a perspective view and FIG. 7B is a side view illustrating a situation in which a gate-driving-circuit substrate in accordance with an embodiment of the invention has been attached to a power module 20.

DETAILED DESCRIPTION OF THE INVENTION

Figure 1:
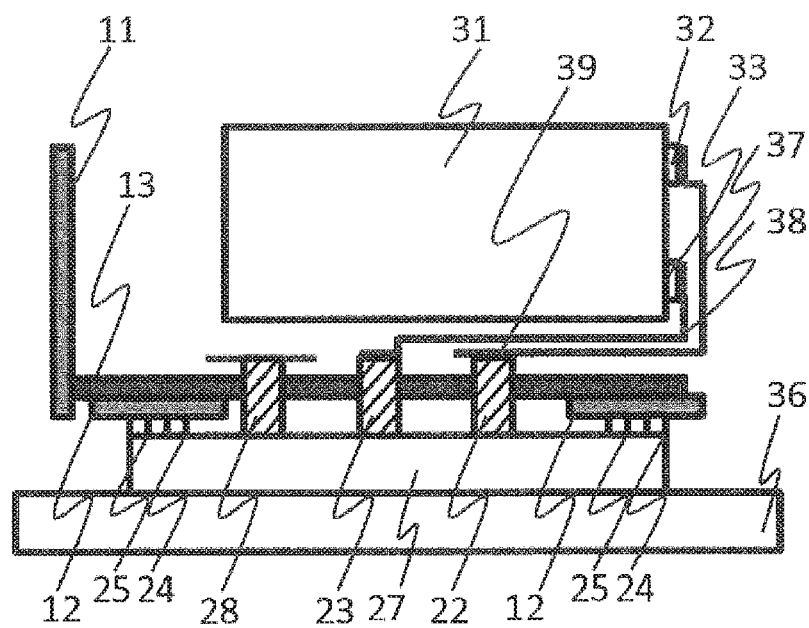
FIG. 1 is a side view illustrating the configuration of a power converting apparatus described in patent document 1.

The following describes embodiments of the invention in detail.

FIG. 2 illustrates the configuration of a gate driving apparatus 10 in accordance with an embodiment of the invention. FIG. 3 is an explanatory diagram of the circuit configuration of the power module 20. FIG. 4 illustrates the configuration of a gate-driving-circuit substrate.

FIG. 2 depicts the gate driving apparatus 10 attached integrally to the power module 20 on a cooler (placement member, heat sink, or heat exchanger) 105 for transferring the heat generated by the power module 20 to fluid medium, air or a liquid coolant.

The gate driving apparatus 10 includes a gate-driving-circuit substrate 101 and covers 103U and 103L that cover the entirety of the gate-driving-circuit substrate 101. The cover 103U is formed of an insulation material and is a hollow-box-shaped cover that has a bottom surface with an opening. The cover 103L is formed of an insulation material and is a hollow-box-shaped cover that has a top surface with an opening.

The gate-driving-circuit substrate 101 is shaped like a rectangle that has four sides clamped by the openings of the covers 103U and 103L from upper and lower.

A control terminal unit provided at the gate-driving-circuit substrate 101 is directly connected to a control terminal unit of the power module 20 by a connection screw 106. Details of the gate driving apparatus 10 will be described hereinafter.

The power module 20 is a 2-in-1 type power-module that has two switching elements, a MOSFET 1 and a MOSFET 2, accommodated in one package. Note that "MOSFET" is an abbreviation for Metal-Oxide Semiconductor Field-Effect Transistor.

As illustrated in FIG. 3, the MOSFET 1 and the MOSFET 2 are connected in series to each other in the power module 20.

The power module 20 includes, as main terminals, a high-potential terminal D1 (202) connected to a drain terminal of the MOSFET 1, a low-potential terminal S2 (203) connected to a source terminal of the MOSFET 2, and an output terminal D2S1 (208) connected to a point of connection between a source terminal of the MOSFET 1 and a drain terminal of the MOSFET 2.

The power module 20 includes, as control terminals, a gate control terminal G1 (204a1) and a ground control terminal S1 (205a1) that are connected to the gate terminal and the source terminal of the MOSFET 1, and a gate control terminal G2 (204a2) and a ground control terminal S2 (205a2) that are connected to the gate terminal and the source terminal of the MOSFET 2.

The power module is not limited to a 2-in-1 type power-module, and may be a 1-in-1 type power module that has only one switching element installed therein, or may be a power module of a type that has a plurality of switching elements installed therein, e.g., a 4-in-1 type power module that has four switching elements installed therein.

The switching element is not limited to a MOSFET and may be an IBGT or a bipolar transistor.

Referring to FIG. 2 again, the power module 20 is shaped like a rectangle when seen in a planar view, and is screwed to the cooler 105 by attaching portions 201 provided at the four corners of the power module 20. Descriptions of the screws for attaching the power module 20 to the cooler are omitted herein.

The high-potential terminal 202, the low-potential terminal 203, and the output terminal 208 protrude from the top surface of the power module 20.

The high-potential terminal 202 and the low-potential terminal 203 are electrically connected to a capacitor connected in parallel to a power supply by a main circuit conductor (not illustrated).

The output terminal 208 is electrically connected to a load by main circuit conductors (not illustrated). The main circuit conductors are stacked on the power module 20.

The gate control terminals 204a1 and 204a2 and the ground control terminals 205a1 and 205a2 of the MOSFETs 1 and 2 are provided on one side of the top surface of the power module 20.

The control terminals 204a1, 204a2, 205a1, and 205a2 consist of metal female screws. The control terminals of the female screws are electrically connected to the gate control terminals G1 and G2 and the ground control terminals S1 and S2 of the MOSFETs 1 and 2.

The control terminals are each in contact with corresponding control terminal units of the gate driving apparatus 10 so as to be mechanically and electrically connected to the gate driving apparatus 10 by the connection screw 106.

That is, the control terminals of the power module are in contact with corresponding gate control terminals 204b1 and 204b2 and corresponding ground control terminals 205b1 and 205b2 of the gate-driving-circuit substrate 101 (these control terminals will be described hereinafter) and fixed with screws.

The gate driving apparatus 10 is screwed to the cooler 105 by fixing screws inserted into insertion bores 107D and 107L provided on the back-surface side of the covers 103U and 103L.

As depicted in FIG. 4, the gate-driving-circuit substrate 101, which is shaped like a rectangle, includes, at one end of the substrate, a gate control terminal 204b1 and a ground control terminal 205b1 for establishing connections to the gate control terminal 204a1 and the ground control terminal 205a1 of the MOSFET 1.

The gate-driving-circuit substrate 101 also includes a gate control terminal 204b2 and a ground control terminal 205b2 for establishing connections to the gate control terminal 204a2 and the ground control terminal 205a2 of the MOSFET 2. The gate-driving-circuit substrate 101 has two sets of gate driving circuits formed thereon in accordance with the number of switching elements.

The gate control terminal 204b1 and the ground control terminal 205b1, which are intended to output a gate voltage to the MOSFET 1, are positioned at the front of the gate-driving-circuit substrate 101 and close to one side of the gate-driving-circuit substrate 101.

The gate control terminal 204b2 and the ground control terminal 205b2, which are intended to output a gate voltage to the MOSFET 2, are positioned at the front of the gate-driving-circuit substrate 101 and close to another side of the gate-driving-circuit substrate 101.

A U-shaped notch 121 is provided between a pair of the gate control terminal 204b1 and the ground control terminal 205b1 and a pair of the gate control terminal 204b2 and the ground control terminal 205b2.

The notch 121 is provided to ensure electrical insulation between the pair of the gate control terminal 204b1 and the ground control terminal 205b1 and the pair of the gate control terminal 204b2 and the ground control terminal 205b2.

The gate-driving-circuit substrate 101 includes, at the center of another end of the substrate, a connector 104 for receiving a control signal from a control apparatus (not illustrated).

The gate-driving-circuit substrate 101 includes a pair of through bores 120 located at positions that sandwich the connector 104 and that correspond to the positions of the insertion bores 107D and 107L of the insulation covers 103U and 103L.

The gate-driving-circuit substrate 101 includes an electric part 110 for converting a control signal input from the connector 104 into a gate voltage for the MOSFETs 1 and 2.

The electric part 110, which forms a signal input portion, a power input portion, a logic portion, and a gate driving portion for the gate-driving-circuit substrate 101, is implemented on the surface of the gate-driving-circuit substrate 101 on which the connector 104 is provided.

Two notches 109 are provided at each lateral side of the gate-driving-circuit substrate 101. The intermediate portions of engagement lugs 114U and 114L of the covers 103U and 103L that exclude the lug portions of the engagement lugs 114U and 114L abut the notches 109. This abutment enables the engaged cover 103 to be prevented from being displaced in a vertical direction or a front/back direction.

The gate control terminals 204b1 and 204b2 and the ground control terminals 205b1 and 205b2 of the gate-driving-circuit substrate 101 are each formed of a through hole 117 and a land 118 provided therearound.

The land 118 is electrically connected to the electric part 110 placed on the gate-driving-circuit substrate 101 by wiring within the substrate.

The gate control terminals 204b1 and 204b2 and the ground control terminals 205b1 and 205b2 are each electrically connected to a corresponding control terminal of the power module 20 by inserting the connection screw 106 into the through hole 107 to fix the terminal to the power module 20.

The gate-driving-circuit substrate 101 is clamped by, and thus held in, the box-shaped covers 103U and 103L.

The covers 103U and 103L that clamp the gate-driving-circuit substrate 101 integrally form the gate driving apparatus 10.

The engagement of, and the clamping by, the covers 103U and 103L allow the entirety of the gate-driving-circuit substrate 101 to be covered with an insulator.

As described above, the front-surface portion of the gate driving apparatus 10 is fixed by screwing the control terminal of the gate-driving-circuit substrate 101 to the control terminal of the power module 20.

The back-surface portion of the gate driving apparatus 10 is fixed to the cooler 105 by the fixing screws inserted into the insertion bores 107D and 107L of the covers 103U and 103L.

The following describes the configurations of the covers 103U and 103L. FIG. 5A is a perspective view illustrating the structure of the cover 103L in accordance with an embodiment of the invention. FIG. 5B is a perspective view illustrating the structure of the cover 103U in accordance with an embodiment of the invention.

The cover 103L includes a front-surface wall 103La, a back-surface wall 103Lb, a bottom-surface wall 103Lc, and a pair of side-surface walls 103Ld. The contacts of a back-surface wall 103Lb and a pair of side-surface walls 103Ld are configured a thickness escaping parts 108.

The cover 103L, which is a box-shaped cover that has a top-surface portion with an opening, is formed of an insulating synthetic resin such as polycarbonate or polybutylene terephthalate.

An opening 123 (see FIG. 6A) for allowing a control signal from the control apparatus to be received by the connector 104 of the gate-driving-circuit substrate 101 is provided at the center of the back-surface wall 103Lb.

Each side-surface wall 103Ld has provided thereon the engagement lug 114L, which engages with an engagement bore 115U of the cover 103U, and an engagement lug 115L with which the engagement lug 114U of the cover 103U engages.

The bottom-surface wall 103Lc includes, at the corners of the back-surface side of the bottom-surface wall 103Lc, a pair of cylindrical pedestals 122 protruding outward from the bottom-surface wall, and ribs 119 that reinforce the pedestals 122. The pedestal 122 has an insertion bore 107L formed therein.

The cover 103U includes a front-surface wall 103Ua, a back-surface wall 103Ub, a top-surface wall 103Uc, and a pair of side-surface walls 103Ud.

The cover 103U, which is a box-shaped cover that has a bottom-surface portion with an opening, is formed of an insulating synthetic resin such as polycarbonate or polybutylene terephthalate.

A pair of insertion parts 107U that extend toward the openings on the bottom-surface side are provided at the corners of the top-surface wall 103Uc that are adjacent to the back-surface wall 103Ub and whose positions correspond to the positions of the insertion bores 107L of the cover 103L.

The circular insertion bores 107D are provided on the bottom-surface sides of the individual insertion parts 107U.

Each side-surface wall 103Ud has provided thereon the engagement lug 114U, which engages with an engagement bore 115L of the cover 103L, and the engagement lug 115U, with which the engagement lug 114L of the cover 103U engages.

A flange 116 that extends along the bottom surface toward the front surface (extends in an opposite direction from the back-surface wall 103Ub) is provided on the bottom-surface side of the front-surface wall 103Ua.

The following describes the configuration of the gate driving apparatus 10 that includes the gate-driving-circuit substrate 101 and the covers 103U and 103L. FIG. 6A is a top perspective view illustrating the gate driving apparatus 10 in accordance with an embodiment of the invention. FIG. 6B is a bottom perspective view illustrating the gate driving apparatus 10 in accordance with an embodiment of the invention.

Referring to FIG. 6A and FIG. 6B, at the individual side surfaces of the covers 103U and 103L, the engagement lug 114U of the cover 103U engages with the engagement bore 115L of the cover 103L, and the engagement lug 114L of the cover 103L engages with the engagement lug 115U of the cover 103U.

As a result, the three edges at the back and both side portions of the gate-driving-circuit substrate 101 are clamped and fixed by the bottom-surface rim of the cover 103U, the flange 116, and the top-surface rim of the cover 103L.

The front of the gate-driving-circuit substrate 101 and the electric part 110 on the gate-driving-circuit substrate 101 are covered with the covers 103U and 103L.

None of the gate control terminals 204b1 and 204b2 and the ground control terminals 205b1 and 205b2 of the gate-driving-circuit substrate 101 are covered with the cover 103U or 103L.

These terminals protrude on the front-surface side of the gate driving apparatus 10 in a manner such that these terminals are electrically connected to the gate control terminals 204a1 and 204a2 and the ground control terminals 205a1 and 205a2 of the power module 20.

The connector 104 of the gate-driving-circuit substrate 101 is located at the opening 123 provided on the back-surface wall 103Lb of the cover 103L, and a gate signal line from outside is connectable to the connector 104.

A pair of insertion parts 107U are provided at the corners of the top-surface wall 103Uc of the cover 103U that are adjacent to the back-surface wall 103Ub and whose positions correspond to the pedestal 122 of the cover 103U.

The insertion part 107U, which is shaped like a rectangle when seen in a top view, includes a bottom-surface portion. The bottom-surface portion includes a circular insertion bore 107D (see FIG. 5B) through which a fixing screw (not illustrated) is inserted.

The fixing screw (not illustrated) for attaching the gate driving apparatus 10 to the cooler 105 is inserted from upper the cover 103U in sequence into the insertion bore 107D of the insertion part 107U, the through bore 120 of the gate-driving-circuit substrate 101 (see FIG. 4), and the pedestal 122 (the insertion bore 107L) of the cover 103L.

The head of the fixing screw (not illustrated) is stopped at the bottom-surface portion of the insertion part 107U (the top-surface position of the insertion bore 107D) and is thus not seen on the surface of the cover 103U.

This ensures insulation between the fixing screw (not illustrated), which is at the same potential as the cooler 105, and the main circuit component disposed on the power module 20.

FIG. 7A is a perspective view and FIG. 7B is a side view illustrating a situation in which the gate-driving-circuit substrate 101 has been attached to the power module 20. In particular, FIGS. 7A and 7B depict the gate driving apparatus 10 illustrated in FIG. 2 with the covers 103U and 103L removed therefrom.

The gate control terminals 204b1 and 204b2 and the ground control terminals 205b1 and 205b2 of the gate-driving-circuit substrate 101 are electrically and mechanically connected by the connection screw 106 to the corresponding gate control terminals 204a1 and 204a2 and the corresponding ground control terminals 205a1 and 205a2 of the power module 20.

Accordingly, since the control terminals of the power module 20 are directly connected to the control terminals of the gate-driving-circuit substrate 101, the gate driving apparatus 10 is unlikely to be affected by main circuit noise.

Hence, the gate driving apparatus 10 in accordance with the embodiment is suitable for gate driving of a wide bandgap semiconductor element that performs an on-off operation at high dv/dt or di/dt, such as SiC (silicon carbide) or GaN (gallium nitride).

The gate-driving-circuit substrate 101 is attached to the power module 20 in a manner such that the surface on which the connector 104 and the electric parts 110 (one surface) are disposed faces the cooler 105.

Accordingly, the positions of the connector 104 and the plurality of electric parts 110 are lower than the position of the power module 20. This allows the space between the gate-driving-circuit substrate 101 and the cooler 105 to be utilized effectively.

Some parts may be disposed on the other surface of the gate-driving-circuit substrate 101. The position of the parts disposed on this other surface of the gate-driving-circuit substrate 101 is preferably lower than the positions of the high-potential terminal 202, the low-potential terminal 203, and the output terminal 208 of the power module 20.

Accordingly, disposing parts that are short in height on the other surface of the gate-driving-circuit substrate 101 allows physical interference from the main circuit conductor connected to the main terminal of the power module 20 to be avoided.

A measuring terminal for measuring the voltage of the parts of the gate driving circuit is preferably disposed on the other surface of the gate-driving-circuit substrate 101.

In particular, by removing the cover 103U, the voltage of the parts of the gate driving circuit may be readily measured to examine the operation of the gate driving circuit.

Figure 8B:
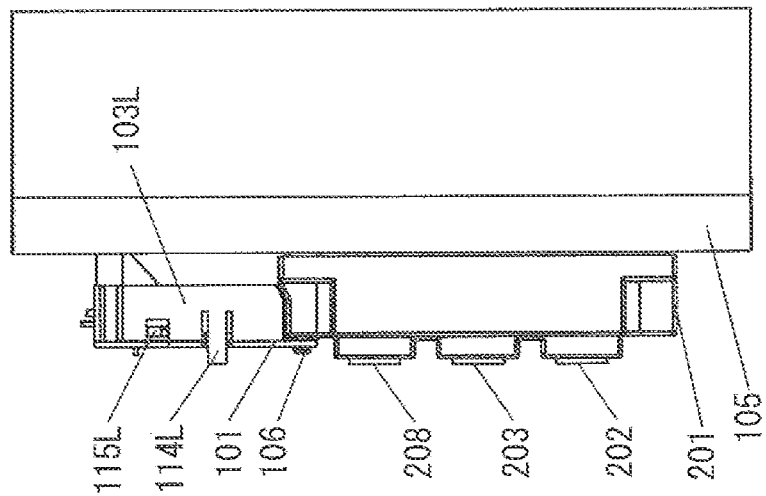
FIG. 8A is a perspective view and FIG. 8B is a side view illustrating a situation in which a gate driving apparatus 10 (without a cover 103U) in accordance with an embodiment of the invention has been attached to a power module 20.
Figure 8A:
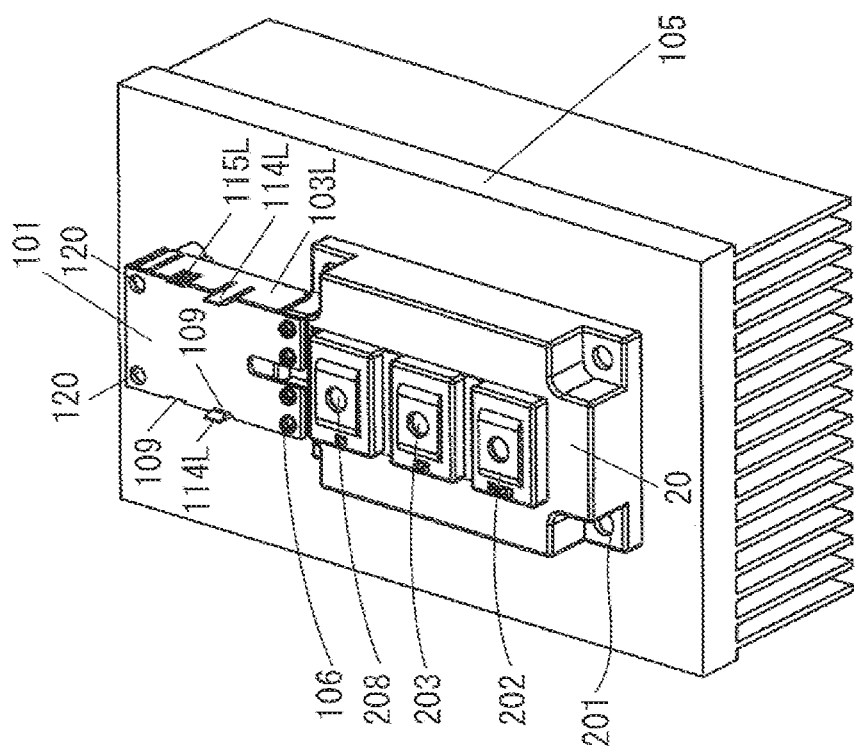

FIG. 8A is a perspective view and FIG. 8B is a side view illustrating the gate driving apparatus 10 with the cover 103U (see FIG. 2) removed therefrom.

The gate-driving-circuit substrate 101 is supported by the cover 103L with the pedestal 122 abutting the cooler 105, and by the gate control terminals 204b1 and 204b2 and the ground control terminals 205b1 and 205b2 that have been screwed to the control terminal unit of the power module 20.

Although the gate driving apparatus 10 of the embodiment has been described with reference to the figures that indicate that the gate driving apparatus 10 has been attached to the cooler 105, the gate driving apparatus may be attached to another member.

For example, the gate driving apparatus 10 may be attached to an air-channel forming member. In this case, the cooler 105 is formed in a manner such that one end thereof (a lateral end of the gate driving apparatus 10) is located at or near the center of the gate driving apparatus 10.

An air-channel member is disposed at a lower portion of the gate driving apparatus 10. The pedestal 122 of the cover 103 abuts the top surface of the air-channel member, and the gate driving apparatus 10 is attached using a fixing screw (not illustrated).

As described above, the gate driving apparatus 10 in accordance with the embodiment allows the two covers 103U and 103L that can be vertically separated to engage with, and clamp, the gate-driving-circuit substrate 101 from upper and lower so as to insulate the gate-driving-circuit substrate 101.

The gate driving apparatus 10 can also ensure insulation from main circuit components and prevent dirt or damage that could be caused by intrusion of dust. The configuration is not limited to the covers 103U and 103L that can be vertically separated, and the covers 103U and 103L may be horizontally separated.

The covers 103U and 103L clamping and fixing the gate-driving-circuit substrate 101 enables the gate-driving-circuit substrate 101 to be protected from vibrations and impacts.

INDUSTRIAL APPLICABILITY

The gate driving apparatus of the invention, which is attached integrally to the power module, can be attached to the cooler so as to form a power converting apparatus such as a chopper apparatus, an inverter apparatus, or a converter apparatus. In particular, applying the gate driving apparatus of the invention to a railway-vehicle power converting apparatus is effective for improving the dielectric strength and the vibration resistance of the gate driving apparatus and for preventing dirt and damage.

What is claimed is:

1. A gate driving apparatus for driving a power module, the gate driving apparatus comprising:
    a gate-driving-circuit substrate including
        a gate control terminal, and a ground control terminal electrically connectable to a power module gate control terminal and a power module ground control terminal, respectively, and
        a gate driver circuit for supplying driving signals to drive the power module; and
    an insulation cover covering portions of the gate-driving-circuit substrate other than the gate control terminal and the ground control terminal of the gate-driving-circuit substrate, the portions covered by the insulation cover including the gate driver circuit, the gate-driving-circuit substrate being clamped and fixed within the insulation cover.

2. The gate driving apparatus according to claim 1, wherein
    the gate driving apparatus is disposable on a placement member, and
    the insulation cover includes an attaching portion for supporting and fixing the insulation cover on the placement member.

3. The gate driving apparatus according to claim 2, wherein the placement member is a heat sink to which the power module is attached.

4. The gate driving apparatus according to claim 2, wherein the placement member includes a cooler configured to transfer the heat generated by the power module, and
    wherein the attaching portion is interposed between the cooler and the gate-driving-circuit substrate and fixes the gate-driving-circuit substrate on the cooler.

5. The gate driving apparatus according to claim 1, wherein the gate control terminal and the ground control terminal of the gate-driving-circuit substrate are electrically and mechanically connected to the power module gate control terminal and the power module ground control terminal, respectively.

6. The gate driving apparatus according to claim 1, wherein
    the insulation cover includes a box-shaped first insulation cover and a box-shaped second insulation cover that each have an opening, and
    the insulation cover supports the gate-driving-circuit substrate by engaging the first insulating cover and the second insulating cover in a state in which the respective openings of the first insulating cover and the second insulating cover face each other, and the first insulating cover and the second insulating cover sandwich the gate-driving-circuit substrate therebetween.

7. A power converting apparatus comprising the gate driving apparatus according to claim 1.

8. A power converting apparatus comprising the gate driving apparatus according to claim 2.

9. A power converting apparatus comprising the gate driving apparatus according to claim 5.

10. A power converting apparatus comprising the gate driving apparatus according to claim 6.

11. A railway-vehicle power converting apparatus comprising the gate driving apparatus according to claim 1.

12. A railway-vehicle power converting apparatus comprising the gate driving apparatus according to claim 2.

13. A railway-vehicle power converting apparatus comprising the gate driving apparatus according to claim 5.

14. A railway-vehicle power converting apparatus comprising the gate driving apparatus according to claim 6.

15. A power module device, comprising:
    a power module including a power module gate control terminal and a power module ground control terminal; and
    a gate driving apparatus including
        a gate-driving-circuit substrate including
            a gate control terminal, and a ground control terminal electrically connected to the power module gate control terminal and the power module ground control terminal, respectively, and
            a gate driver circuit for supplying driving signals to drive the power module, and
        an insulation cover covering portions of the gate-driving-circuit substrate other than the gate control terminal and the ground control terminal of the gate-driving-circuit substrate, the portions covered by the insulation cover including the gate driver circuit, the gate-driving-circuit substrate being clamped and fixed within the insulation cover.

16. The power module device according to claim 15, further comprising
    a placement member, wherein
    the insulation cover includes an attaching portion, the insulation cover being supported and fixed by the attaching portion on the placement member.

17. The power module device according to claim 16, wherein the placement member includes a heat sink.

* * * * *